(12) United States Patent
Kanazawa

(10) Patent No.: US 6,864,720 B2
(45) Date of Patent: Mar. 8, 2005

(54) SEMICONDUCTOR INTEGRATED CIRCUIT AND CIRCUIT DESIGNATING SYSTEM

(75) Inventor: Masahiro Kanazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 10/428,762

(22) Filed: May 5, 2003

(65) Prior Publication Data

US 2004/0021485 A1 Feb. 5, 2004

(30) Foreign Application Priority Data

May 9, 2002 (JP) ......................................... 2002-133714

(51) Int. Cl.[7] ..................... H03K 19/003; H03K 19/096
(52) U.S. Cl. ......................................... 326/93; 327/295
(58) Field of Search .................... 326/93, 46; 327/293, 327/295

(56) References Cited

U.S. PATENT DOCUMENTS

| | | | |
|---|---|---|---|
| 5,892,373 A | | 4/1999 | Tupuri et al. |
| 5,923,188 A | * | 7/1999 | Kametani et al. ............. 326/93 |
| 6,020,774 A | * | 2/2000 | Chiu et al. .................. 327/295 |
| 6,246,277 B1 | * | 6/2001 | Nitta et al. ................. 327/292 |

FOREIGN PATENT DOCUMENTS

| | | |
|---|---|---|
| JP | 2001-84287 | 3/2001 |
| JP | 2001-155045 | 6/2001 |

* cited by examiner

Primary Examiner—Daniel D. Chang
(74) Attorney, Agent, or Firm—Oblon, Spivak, McClelland, Maier & Neustadt, P.C.

(57) ABSTRACT

A semiconductor integrated circuit is disclosed, which comprises a tree structure of buffer circuit groups configured to have an enable-signal-controlled AND buffer circuit at least in a final stage, a latch circuit provided in a correspondence to the enable-signal-controlled AND buffer circuit and configured to receive an enable signal and clock signal and deliver an output to an input portion of a final stage buffer circuit, an enable-signal-controlled AND buffer circuit provided in a portion of an intermediate stage of the buffer circuit groups, and an OR circuit provided in a correspondence to the intermediate stage enable-signal-controlled AND buffer circuit and configured to take a logical sum of a plurality of enable signals for controlling the operations of a plurality of enable-signal-controlled AND buffer circuits more on a load circuit side and deliver a logical sum output to an input portion of the intermediate stage enable-signal-controlled AND buffer circuit.

12 Claims, 6 Drawing Sheets

US 6,864,720 B2

SEMICONDUCTOR INTEGRATED CIRCUIT AND CIRCUIT DESIGNATING SYSTEM

CROSS-REFERENCE TO RELATED APPLICATIONS

This application is based upon and claims the benefit of priority from the prior Japanese Patent Application No. 2002-133714, filed May 9, 2002, the entire contents of which are incorporated herein by reference.

BACKGROUND OF THE INVENTION

1. Field of the Invention

The present invention relates to a semiconductor integrated circuit and its circuit designing system and, in particular, to a circuit designing system using a gated clock circuit and a computer aided design (CAD).

2. Description of the Related Art

As the technique for achieving the lower power dissipation of a semiconductor integrated circuit (LSI), a gated clock circuit has been put to practical use which has a tree structure of buffer circuit groups. This gated clock circuit is controlled by an enable signal to allow a clock signal for synchronization operation to be selectively supplied to a portion of a load circuit group through a portion of the buffer circuit groups in the tree structure.

FIG. 8 is a block circuit showing an example of a conventional gated clock circuit. In the gated clock circuit, a clock signal clk for synchronization operation is supplied to load circuit groups (for example, flip-flop circuit groups) through initial to final stages (in this example, through three stages) of buffer circuit groups in a tree structure. A two-branch structure of buffer circuit groups is shown in FIG. 8.

The clock signal clk is input to a buffer 11 in an initial stage (first branch stage) and an output clk1 of the buffer 11 is inputted to buffers 12, 13 in a subsequent stage. An output clk2 of the buffer 12 is inputted to buffers 14, 15 in a subsequent stage (second branch stage). The output clk3 of the buffer 14 is supplied to one input of each of enable-signal-controlled AND buffers (gated AND buffers) 16, 17 in a subsequent stage (third branch stage).

The enable-signal-controlled AND buffer 16 receives, as the other input, an output enout1 of a negative edge latch circuit 18 which receives an enable signal en1 and clock signal CLK. An output gclk1 of the enable-signal-controlled AND buffer 16 is supplied as a clock input to a first flip-flop circuit (F/F1) group.

The enable-signal-controlled AND buffer 17 receives, as the other input, an output enout2 of a negative edge latch circuit 19 which receives an enable signal en2 and clock signal. An output gclk2 of the enable-signal-controlled AND buffer 17 is supplied as a clock input to a second flip-flop circuit (F/F2) group.

It is to be noted that, when the clock signal CLK is in a "L" level, the negative edge latch circuits 18, 19 allow corresponding enable signals en1, en2 to pass through and, when the clock signal CLK is in a "H" level, these negative edge latch circuits 18, 19 hold the corresponding enable signals en1, en2. By doing so, it is possible to prevent any operation error caused by a whisker-like input noise of the clock signal CLK.

It is also to be noted that, as in the case of a system of the buffer 14, enable-signal-controlled AND buffers 20, 21 are connected to the load side of the buffer 15 of the second branch stage and, to the enabling buffers 20, 21, negative edge latch circuits 22, 23 and flip-flop circuit F/F3 and F/F4 groups are connected respectively.

The output clk4 of the buffer 15 is supplied to one input of each of enable-signal-controlled AND buffers (gated AND buffers) 20, 21 in a subsequent stage (third branch stage).

The enable-signal-controlled AND buffer 20 receives, as the other input, an output enout3 of a negative edge latch circuit 22 which receives an enable signal en3 and clock signal CLK. An output gclk3 of the enable-signal-controlled AND buffer 20 is supplied as a clock input to a third flip-flop circuit (F/F3) group.

The enable-signal-controlled AND buffer 21 receives, as the other input, an output enout4 of a negative edge latch circuit 23 which receives an enable signal en4 and clock signal. An output gclk4 of the enable-signal-controlled AND buffer 21 is supplied as a clock input to a fourth flip-flop circuit (F/F4) group.

It is to be noted that, when the clock signal CLK is in a "L" level, the negative edge latch circuits 22, 23 allow corresponding enable signals en3, en4 to pass through and, when the clock signal CLK is in a "H" level, these negative edge latch circuits 18, 19 hold the corresponding enable signals en3, en4. By doing so, it is possible to prevent any operation error caused by a whisker-like input noise of the clock signal CLK.

FIG. 9 is a timing chart showing a practical operation (signals) of the circuit shown in FIG. 8. When the output enout1 of the latch circuit 18 is in a "1" state, the output gclk1 of the enable-signal-controlled AND buffer 16 is activated and, with the same operation as that of the clock signal clk, data is loaded to the first flip-flop circuit (F/F1) group. When, on the other hand, the output enout1 of the latch circuit 18 is in a "0" state, the output gclk1 of the enable-signal-controlled AND buffer 16 is deactivated and the F/F1 group is not supplied with a clock so that it is not operated. Since, at this time, no clock is supplied to the F/F1 group, the gated clock circuit becomes lower in power dissipation than an ordinary circuit.

When the output enout2 of the latch circuit 19 is in "1" state, the output gclk2 of the enable-signal-controlled AND buffer 17 is activated and, with the same operation as the lock signal clk, data is loaded to the second flip-flop circuit (F/F2) group. When the output enout2 of the latch circuit 19 is in a "0" state, the output glk2 of the enable-signal-controlled AND buffer 17 is deactivated and the F/F2 group is not supplied with a clock so that it is not operated. Therefore, the gated clock circuit becomes lower in power dissipation than the ordinary circuit.

In the circuit shown in FIG. 8, on the other hand, the output clk3 of the buffer 14 in the preceding stage (second branch stage) of the enable-signal-controlled AND buffers 16, 17 continues ON as in the case of the input clock clk.

It is functionally sufficient, however, that, only when the output enout1 of the latch circuit 18 or the output enout2 of the latch circuit 19 is in the "1" state, the output clk3 of the buffer 14 performs the same operation as the input clock clk. In other word, when the output enout1 of the latch circuit 18 and output enout2 of the latch circuit 19 are both in the "0" state, the output clock clk3 of the buffer 14 needs not operate in the same way as the input clock.

However, in the circuit shown in FIG. 8, the output clock clk3 of the buffer 14 continues ON as in the same way as the input clock clk, even when the output enout1 of the latch circuit 18 and output enout2 of the latch circuit 19 are both in the "0" state. As the result, there occurs a wasteful power dissipation.

As set out above, in the gate clock circuit using the buffer circuit groups in the conventional tree structure, even when there is no need to supply the clock to a buffer circuit closer to the load circuit side (leaf side), another buffer circuit closer to a root side than said buffer circuit normally continues ON, thus involving a wasteful power dissipation problem.

BRIEF SUMMARY OF THE INVENTION

According to an aspect of the present invention, there is provided a semiconductor integrated circuit comprising a tree structure of buffer circuit groups configured to have an enable-signal-controlled AND buffer circuit at least in a final stage; a latch circuit provided in a way to correspond to the enable-signal-controlled AND buffer circuit and configured to receive an enable signal and clock signal and deliver an output to an input portion of a final stage buffer circuit; an enable-signal-controlled AND buffer circuit provided in a portion of an intermediate stage of the buffer circuit groups in the tree structure; and an OR circuit provided in a way to correspond to the intermediate stage enable-signal-controlled AND buffer circuit and configured to take a logical sum of a plurality of enable signals for controlling the operations of a plurality of enable-signal-controlled AND buffer circuits more on a load circuit side and deliver a logical sum output to an input portion of the intermediate stage enable-signal-controlled AND buffer circuit.

According to another aspect of the present invention, there is provided a system for designing a gated clock circuit configured to be controlled by an enable signal to selectively supply a clock signal for synchronization operation to a portion of a load circuit group through a portion of buffer circuit groups in a tree structure, comprising (a) preparing a modified circuit plan against a gated clock circuit by using a computer aided design system; (b) estimating an electric power reduction amount on the modified circuit plan; (c) analyzing a timing relative to the modified circuit plan and confirming that an enable input to a circuit of a modified portion is decided before a clock of the circuit involved is activated; (d) automatically judging whether or not a modified connection be made, as a result of the estimation on the electric power reduction effect and timing analysis and based on a predetermined decision standard; and (e) replacing a buffer circuit on a judged and modified connection part by an enable-signal-controlled AND buffer circuit and modifying a connection to receive a logical sum of enable signals on a load circuit side, as an input other than a clock.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
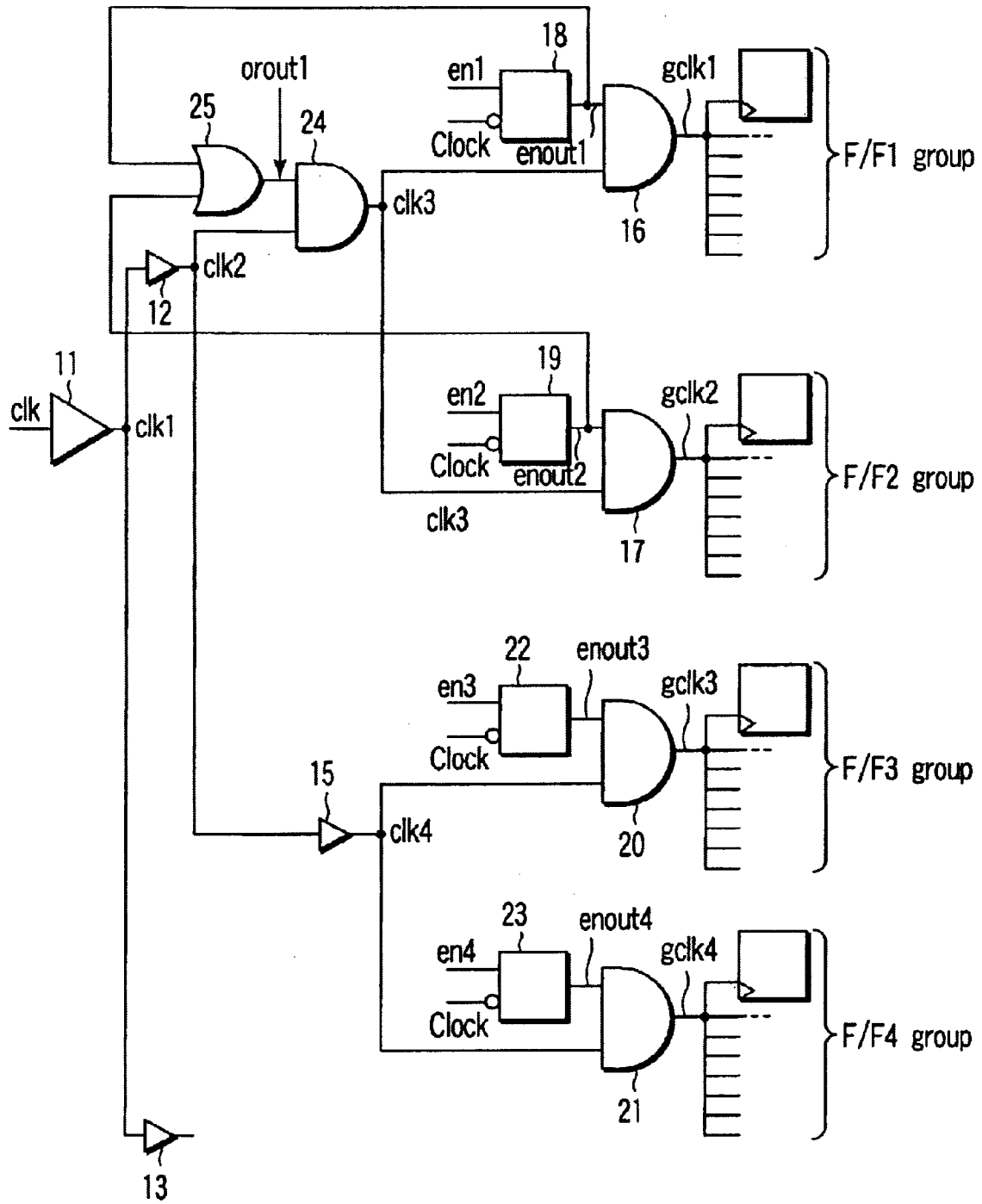
FIG. 1 is a circuit diagram showing one practical form of a gated clock circuit built in an LSI in a first embodiment of the present invention.

The embodiments of the present invention will be described in more detail below with reference to the drawing.

First Embodiment

FIG. 1 is a circuit diagram showing one practical form of a gated clock circuit built in an LSI in the first embodiment of the present invention.

The gated clock circuit of FIG. 1 basically has a tree structure of buffer circuit groups as in the case of a conventional gated clock circuit and is configured to supply a clock signal clk for synchronization operation of this circuit to at least a portion of load circuit groups (flip-flop circuit groups in this practical form) through at least a portion of initial to final stages of the buffer circuit groups in the tree structure. A two-branch structure of buffer circuit groups is shown in FIG. 1, as in the case of FIG. 8.

The gated clock circuit shown in FIG. 1 is different from the conventional gated clock circuit set out above in connection with FIG. 8 in the following respects and the same reference is attached to the same portions or elements of the latter circuit for brevity sake.

(1) An enable-signal-controlled AND buffer 24 is used in place of a buffer 14 of a second branch stage and has one input which receives an output clk2 of the buffer 12 of a preceding stage (first branch stage) and the other input which receives an output orout1 of a two-input terminal OR gate 25.

(2) The OR gate 25 is configured to take a logical sum of outputs enout1 and enout2 (enable signal groups) of latch circuits 18, 19 provided in a way to correspond to enable-signal-controlled AND buffers 16, 17 more on a leaf side than the enable-signal-controlled AND buffer 24.

That is, in FIG. 1, an input clock clk is supplied to a first stage buffer 11 and an output clk1 is supplied to buffers 12, 13 in a subsequent stage (first branch stage). An output clk2 of the buffer 12 is supplied to one input of an enable-signal-controlled AND buffer 24 AND buffer 15 in a subsequent stage (second branch stage).

An output clk3 of the enable-signal-controlled AND buffer 24 is supplied to one input of each of the enable-signal-controlled AND buffers 16, 17 in a subsequent stage (third branch stage, final stage). An output enout1 of a negative edge latch circuit 18 is supplied to the other input of the enable-signal-controlled AND buffer 16, noting that the negative edge latch circuit 18 receives an enable signal en1 and clock signal Clock. An output gclk1 of the enablesignal-controlled AND buffer 16 is supplied as a clock input to a first flip-flop circuit (F/F1) group.

An output enout2 of a negative edge latch circuit 19 is supplied to the other input of the enable-signal-controlled AND buffer 17, noting that the negative edge latch circuit 19 receives an enable signal en2 and clock signal Clock. An output gclk2 of the enable-signal-controlled AND buffer 17 is supplied to the clock input of a second flip-flop circuit (F/F2) group.

The OR gate 25 for taking a logical sum of outputs enout1 and enout2 (enable signal groups) of the enable-signal-controlled AND buffers 18, 19 is provided in a way to correspond to the enable-signal-controlled AND buffers 16, 17 and an output orout1 of the OR gate 25 is supplied to the other input terminal of the enable-signal-controlled AND buffer 24.

It is to be noted that, as in the case of the load side circuit of the enable-signal-controlled AND buffer 24, enable-signal-controlled AND buffers 20, 21 are connected to the load side of the buffer 15 in the second branch stage and that negative edge latch circuits 22 and 23 and F/F3 and F/F4 groups are connected respectively to the enable-signal-controlled AND buffers 20 and 21.

Figure 2:
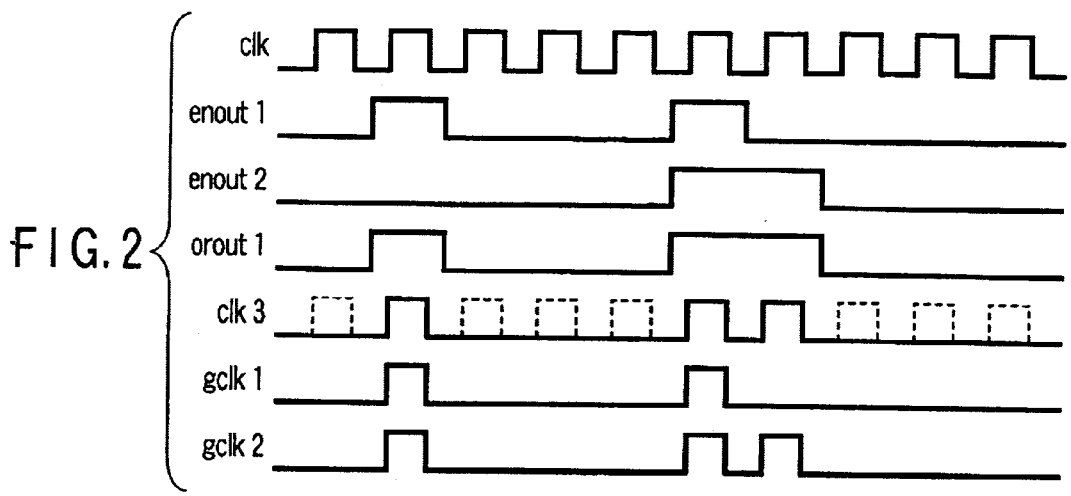
FIG. 2 is a timing chart showing the practical operation of the circuit in FIG. 1.

FIG. 2 is a timing chart showing a practical operation (signals) of the circuit shown in FIG. 1.

When the output enout1 of the latch circuit 18 is in a "1" state, the output gclk1 of the enable-signal-controlled AND buffer 16 is activated and, in the same operation as the clock signal clk, data is loaded to the first flip-flop circuit (F/F1) group.

When the output enout1 of the latch circuit 18 is in a "0" state, the output gclk1 of the enable-signal-controlled AND buffer 16 is deactivated and no clock is supplied to the F/F1 group so that no operation is effected. Since, at this time, no clock is supplied to the F/F1 group, the gated clock circuit becomes lower in power dissipation than an ordinary circuit as shown in FIG. 8.

When the output enout2 of the latch circuit 19 is in the "1" state, the output gclk2 of the enable-signal-controlled AND buffer 17 is activated and, in the same operation as the clock signal clk, data is loaded into the second flip-flop circuit (F/F2) group.

When, on the other hand, the output of the latch circuit 19 is in the "0" state, the enable-signal-controlled AND buffer 17 is deactivated and no clock is supplied to the flip-flop group so that no operation is made. Since at this time no clock is supplied to the F/F2 group and the gated clock circuit becomes lower in power dissipation than the ordinary circuit as shown in FIG. 8.

As set forth above, the output clk3 of the enable-signal-controlled AND buffer 24 is activated by the output orout1 of the OR gate 25 and operates in the same way as the input clock clk, only when the output enout1 of the latch circuit 18 is in the "1" state or the output enout2 of the latch circuit 19 is in the "1" state.

In other words, when the output enout1 of the latch circuit 18 and output enout2 of the latch circuit 19 are both in the "0" state, the output clk3 of the enable-signal-controlled AND buffer 24 is deactivated by the output orout1 of the OR gate 25 so that any wasteful power dissipation is suppressed. In this case, where the output enout1 of the latch circuit 18 and output enout2 of the latch circuit 19 become the same logical level in the same timing, an effective result in particular is obtained.

Figure 8:
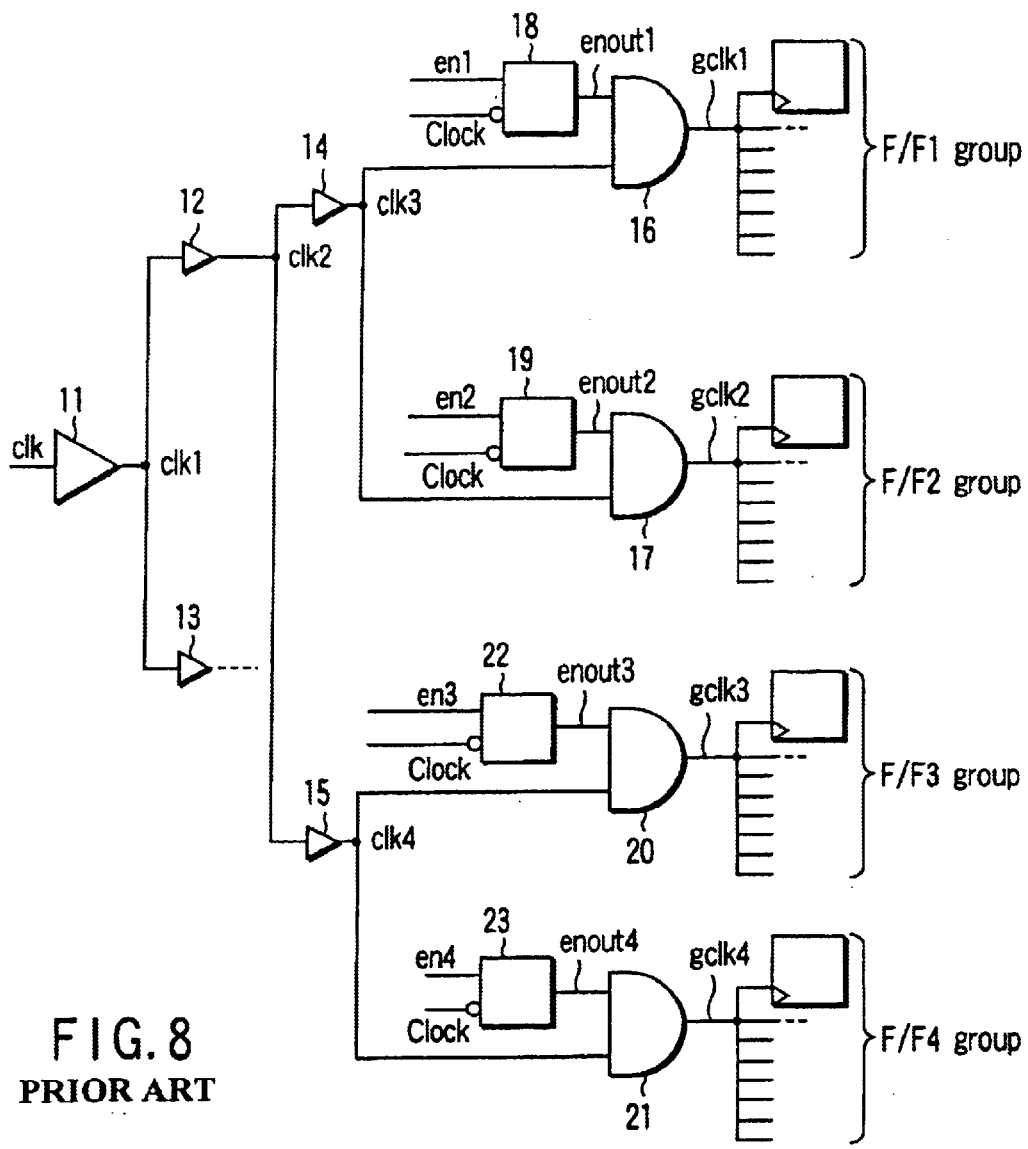
FIG. 8 is a block circuit showing one example of a conventional gated clock circuit.
Figure 9:
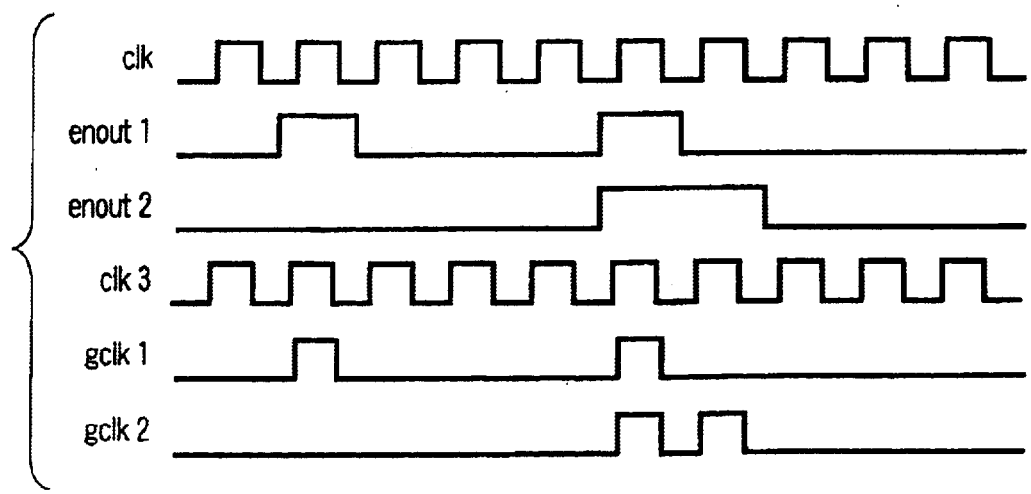
FIG. 9 is a timing chart showing an operation example of the circuit of FIG. 8.

That is, in the gated clock circuit of this embodiment (FIG. 1), since the output clk3 of the enable-signal-controlled AND buffer 24 is operative only at a minimal required time, that is, at enout1="1" or enout2="1" only, the power dissipation can be reduced in driving the enable-signal-controlled AND buffer 24 and charging/discharging of clk3 in comparison with a conventional circuit (for example, as shown in FIG. 8) where clk3 continues ON at all times.

Second Embodiment

Figure 3:
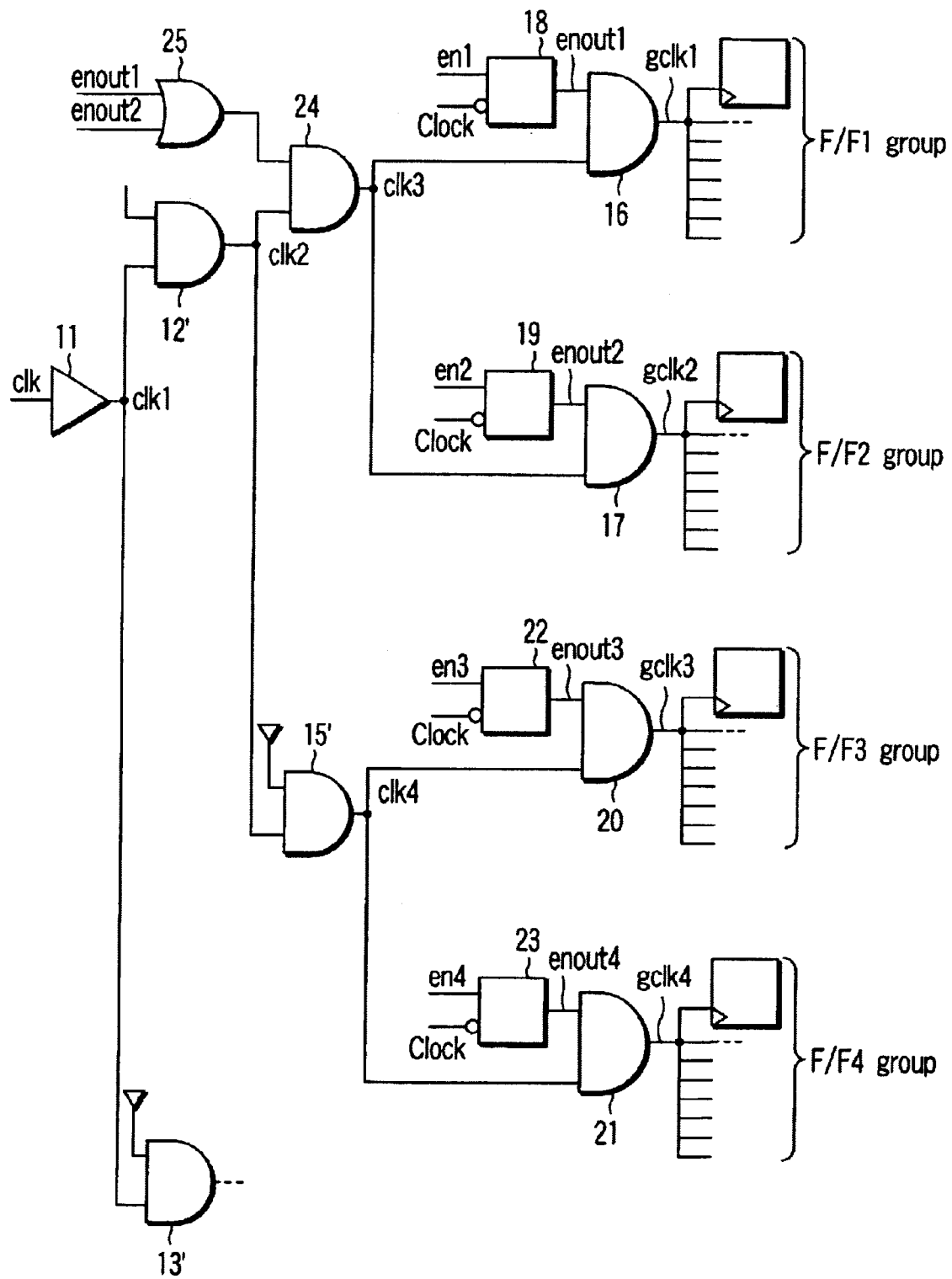
FIG. 3 is a circuit diagram showing another practical form of a gated clock circuit according to a second embodiment of the present invention.

FIG. 3 shows one practical form of a gated clock circuit in a second embodiment of the present invention. This gated clock circuit is different from that of the first embodiment (FIG. 1) in that the buffers 12, 13, 15 in the respective branch stages are replaced with the enable-signal-controlled AND buffers 12', 13', 15' and the same reference numerals are employed to designate those remaining parts or elements.

According to the second embodiment all the buffer circuits in the clock tree structure can be structured by the enable-signal-controlled AND buffers.

Third Embodiment

Although, in the gated clock circuit of the first embodiment, the enable-signal-controlled AND buffer 24 is provided only at one of the two systems in the second branch stage and the buffer 15 is left at the other system as in the conventional case of FIG. 8, it may be possible to provide enable-signal-controlled AND buffers in all systems in the second branch stage for example as will be set out below in connection with the third embodiment.

Figure 4:
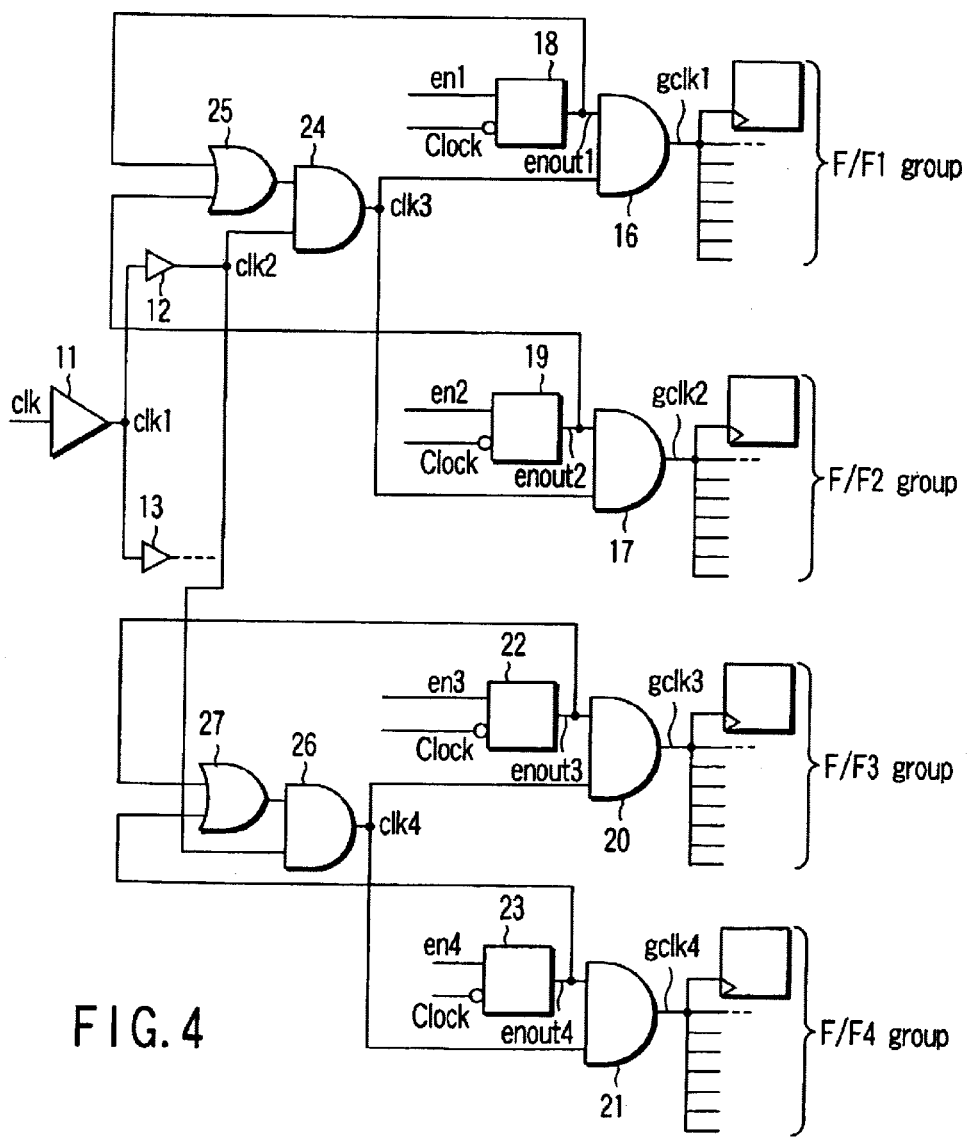
FIG. 4 is a circuit diagram showing another practical form of a gated clock circuit according to a third embodiment of the present invention.

FIG. 4 shows one practical form of a gated clock circuit in the third embodiment of the present invention. The gated clock circuit is different from the counterpart of the first embodiment (FIG. 1) in the following respects and the remaining portion is the same as that of the first embodiment with the same references given to designate the same parts or elements.

That is, in the other system of the second branch stage, an enable-signal-controlled AND buffer 26 is used in place of the buffer 15. An output clk2 of the buffer 12 in a preceding stage (first branch stage) is supplied to one input of the enable-signal-controlled AND buffer 26 and an output orout2 of a two-input OR gate 27 is supplied to the other input of the enable-signal-controlled AND buffer 26. The OR gate 27 is configured to take a logical sum of outputs enout3 and enout4 of the latch circuits 22 and 23 provided in a way to correspond to enable-signal-controlled AND buffers 20 and 21 more on a leaf side than the enable-signal-controlled AND buffer 26.

According to the third embodiment, the power dissipation is further reduced with a resultant advantage.

Fourth Embodiment

Figure 5:
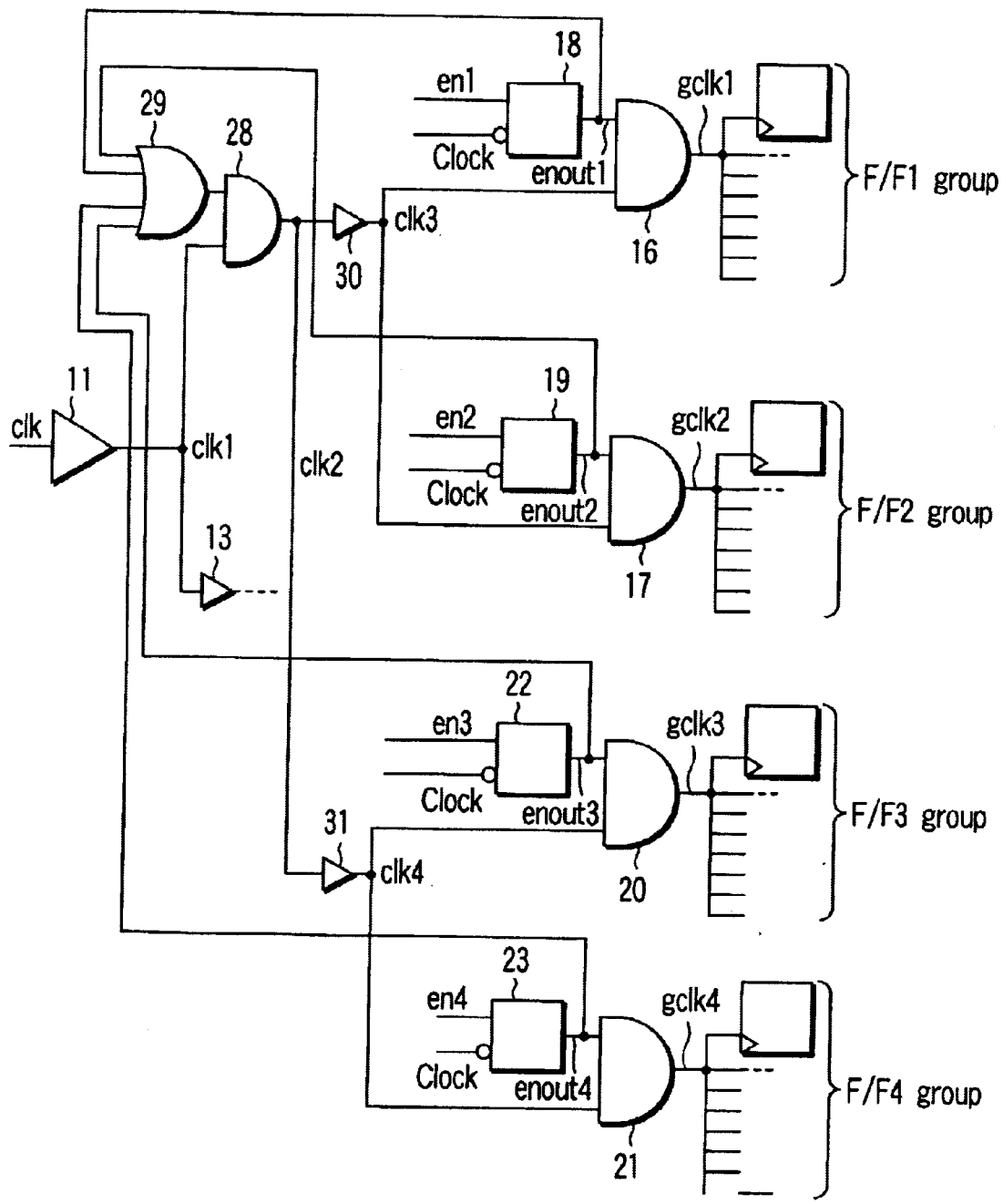
FIG. 5 is a circuit diagram showing another practical form of a gated clock circuit according to a fourth embodiment of the present invention.

FIG. 5 shows one practical form of a gated clock circuit in a fourth embodiment of the present invention. The gated clock circuit of the fourth embodiment is different from the counterpart of the third embodiment (FIG. 4) in that more enable-signal-controlled AND buffers are used at a root-side branch stage (first branch stage in this case). Also, several other parts or elements are different between the gated clock circuits of the third and fourth embodiments. The same reference numerals are employed to designate the same parts or elements.

(1) In place of the buffer 12 of one system in one branch stage use is made of an enable-signal-controlled AND buffer 28 having one input for receiving an output clk1 of a buffer 11 in a preceding stage (root stage) and the other input for receiving an output orout of a four-input OR gate 29. Further, the output of the buffer 28 is supplied through a buffer 30 to enable-signal-controlled AND buffers 16, 17.

(2) The OR gate 29 is configured to take a logical sum of outputs enout1 and enout2 of latch circuits 18 and 19 provided in a way to correspond to enable-signal-controlled AND buffers 16 and 17 more on a leaf side than the enable-signal-controlled AND buffer 28 of one system in the first branch stage and outputs enout3 and enout4 (enable signal group) of latch circuits 22, 23 provided in a way to correspond to enable-signal-controlled AND buffers 20 and 21 more on the leaf side than a buffer 31 of the other system in the first branch stage.

According to the fourth embodiment it is also possible to effectively reduce any wasteful power dissipation.

Variant of Fourth Embodiment

Figure 6:
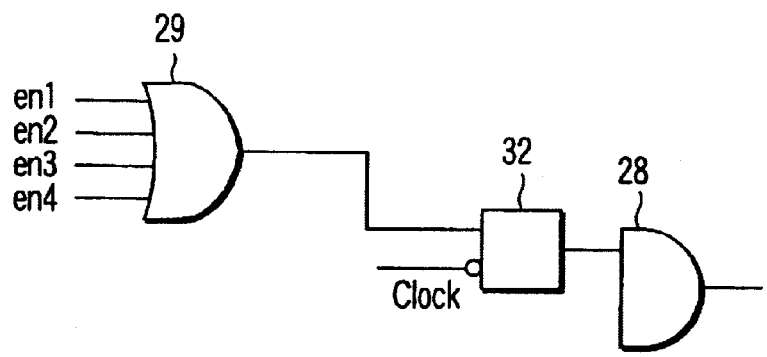
FIG. 6 is a circuit diagram showing a variant of an OR gate in the gated clock circuit according to the fourth embodiment of the present invention.

FIG. 6 shows a variant of the OR gate in the gated clock circuit of the fourth embodiment of the present invention.

In comparison with the OR gate (FIG. 5), a circuit of FIG. 6 is such that, in place of the respective outputs enout1 to enout4 (enable signal group) of the latch circuits 18, 19, 22 and 23, an OR gate 29 receives enable signals en1, en2, en3 and en4 of the input sides of the latch circuits 18, 19, 22 and 23 and that the output of the OR gate 29 is latched to a latch circuit 32 in synchronism with a clock and the output of the latch circuit 32 is inputted to an enable-signal-controlled AND buffer 28. The circuit of FIG. 6 is different from the counterpart of FIG. 5 in these respects and the same reference numerals are employed to designate the same parts and elements.

In the gated clock circuit according to the variant it is possible to obtain substantially the same operation as that of the gated clock circuit of the fourth embodiment. It is, therefore, possible to obtain basically the same effect as that of the gated clock circuit of the fourth embodiment and, further, to secure an improved timing in the case where the connection distance for the input signal of the OR gate 29 is shorter.

Fifth Embodiment

In a fifth embodiment, an explanation will be made below about a circuit designing system for preparing a structure of the gated clock circuit of the embodiment of the present invention from the structure of the conventional gated clock circuit shown, for example, in FIG. 8.

Figure 7:
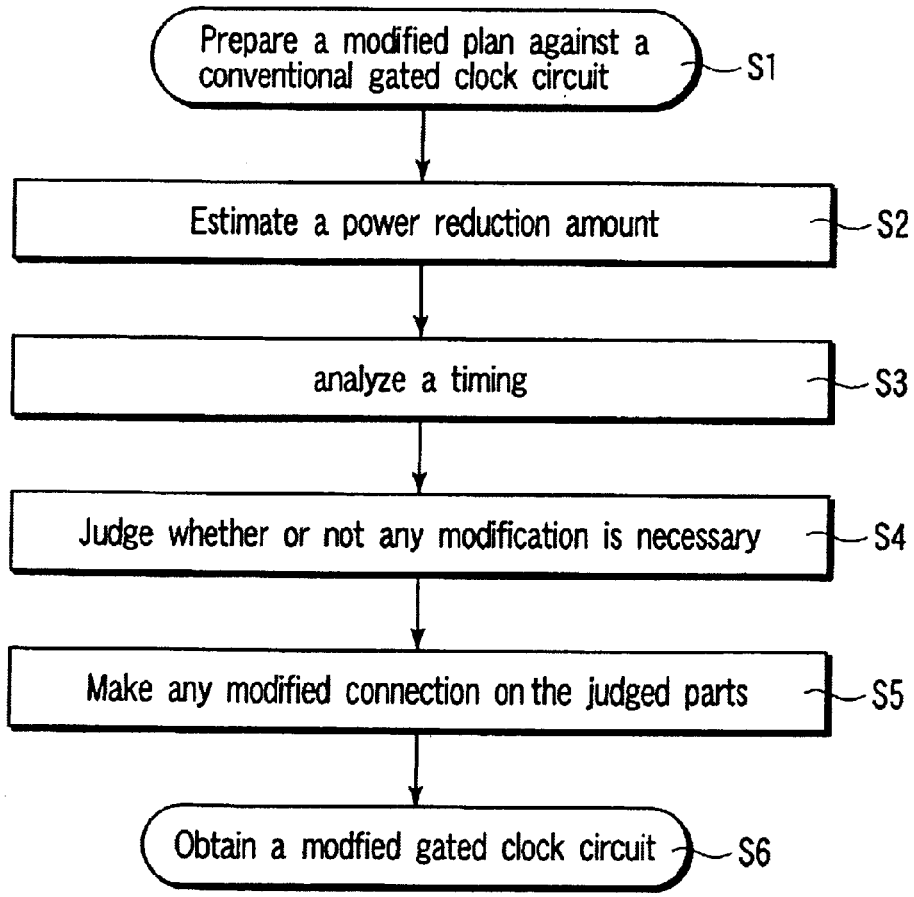
FIG. 7 is a flow chart showing a flow of processing in a designing system for preparing a structure of a gated clock circuit of the present invention from a structure of a conventional gated clock circuit.

FIG. 7 is a flow chart showing a flow of processing in this circuit designing system.

An explanation will be made below about the steps of the process flow.

(a) Step for Preparing a Circuit Plan (S1)

An estimation is made about a circuit structure of modifying the conventional gated clock circuit (a circuit plan is prepared). Although the modification of an interconnection involved can be automatically made with the use of a CAD system, it is possible for the designer to make a design in a semiautomatic way while manually inputting estimation data.

(b) Step for Estimating a Power Reduction Amount in the Circuit Plan (S2)

electric power reducing items:
the charging/discharging power of clk3×(the probability of 1−the output of the OR gate 25 being 1)
the power of the buffer 14 electric power increasing items:
the power of the enable-signal-controlled AND buffer 16
the charging/discharging power in an increased connection amount of enout1 and enout2
the power of the OR gate 25
the charging/discharging power of the output of the OR gate 25

∗ the power reducing amount = the charging/discharging power of $clk3 \times$ (the probability of 1 − the output of the OR gate 25 being1) +

(the power of the buffer 30 −

(the power of the buffer 16 − (the charging/discharging power in the increased connection amount of $enout1$ and $enout2$) − the power of the OR gate 25 − the charging/ discharging power of the output of the OR gate 25

(c) Step for Analyzing the Timing (S3)

It is necessary to, as the conventional timing check, confirm the decision of enout1 and enout2 before the rising of the clock clk3, while according to this embodiment it is necessary to confirm the decision of orout1 before the rising of the clock clk2.

(d) Step for Judging the Presence/Absence of a Modification (S4)

As a result of estimation about the power reduction effect and timing analysis, it is automatically judged, based on a predetermined decision standard, whether or not any modification is made.

(e) Step for Making Any Modified Connection on the Judged Part (S5)

As the judged modified part, a change of the buffer is made to the enable-signal-controlled AND buffer and a connection is modified to receive a logical sum of an enable signal on a leaf side as an input other than a clock.

According to the fifth embodiment, it is possible to realize an automatically modifying circuit designing system from the standpoint of achieving an electric power reduction on the gated clock circuit and it is possible to save a designing time and labor.

According to the respective embodiments, it is possible to provide a semiconductor integrated circuit and its circuit designing system which, if there is no need to supply a clock to a buffer circuit closer to a leaf side in a tree structure of buffer circuit groups, can stop the operation of the buffer circuit closer to a root side than that circuit and suppress any wasteful power dissipation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
a tree structure of buffer circuit groups configured to have an enable-signal-controlled AND buffer circuit at least in a final stage;
a latch circuit provided in a way to correspond to the enable-signal-controlled AND buffer circuit and configured to receive an enable signal and clock signal and deliver an output to an input portion of a final stage buffer circuit;

an enable-signal-controlled AND buffer circuit provided in a portion of an intermediate stage of the buffer circuit groups in the tree structure; and an OR circuit provided in a way to correspond to the intermediate stage enable-signal-controlled AND buffer circuit and configured to take a logical sum of a plurality of enable signals for controlling the operations of a plurality of enable-signal-controlled AND buffer circuits more on a load circuit side and deliver a logical sum output to an input portion of the intermediate stage enable-signal-controlled AND buffer circuit.

2. A semiconductor integrated circuit according to claim 1, wherein the latch circuit comprises a negative edge latch circuit supplied with an enable signal and clock signal.

3. A semiconductor integrated circuit according to claim 1, wherein said plurality of enable signals are respective outputs of a plurality of the latch circuits provided in a way to correspond to the plurality of final stage enable-signal-controlled AND buffer circuits.

4. A semiconductor integrated circuit according to claim 3, wherein the latch circuit comprises a negative edge latch circuit supplied with an enable signal and clock signal.

5. A semiconductor integrated circuit according to claim 1, wherein said plurality of enable signals are respective inputs of a plurality of the latch circuits provided in a way to correspond to the plurality of final stage enable-signal-controlled AND buffer circuits.

6. A semiconductor integrated circuit according to claim 5, wherein the latch circuit comprises a negative edge latch circuit supplied with an enable signal and clock signal.

7. A semiconductor integrated circuit according to claim 1, wherein said intermediate stage AND enable buffer circuit is provided at a portion of a plurality of buffer circuits of a predetermined signal branch stage in the tree structure of buffer circuit groups.

8. A semiconductor integrated circuit according to claim 7, wherein the latch circuit comprises a negative edge latch circuit supplied with an enable signal and clock signal.

9. A semiconductor integrated circuit according to claim 1, wherein said intermediate stage AND enable buffer circuit is provided at each of a plurality of buffer circuits of a predetermined signal branch stage in the tree structure of buffer circuit groups.

10. A semiconductor integrated circuit according to claim 9, wherein the latch circuit comprises a negative edge latch circuit supplied with an enable signal and clock signal.

11. A semiconductor integrated circuit according to claim 1, wherein the enable-signal-controlled AND buffer circuit is provided as each buffer circuit of the buffer circuit groups in the tree structure.

12. A semiconductor integrated circuit according to claim 11, wherein the latch circuit comprises a negative edge latch circuit supplied with an enable signal and clock signal.

* * * * *